United States Patent [19]

Miller et al.

[11] 4,426,569

[45] Jan. 17, 1984

[54] TEMPERATURE SENSOR ASSEMBLY

[75] Inventors: Mark C. Miller, Chanhassen; John R. Arthur, Minneapolis, both of Minn.

[73] Assignee: The Perkin-Elmer Corporation, Norwalk, Conn.

[21] Appl. No.: 397,748

[22] Filed: Jul. 13, 1982

[51] Int. Cl.³ .............................................. C23C 13/12
[52] U.S. Cl. .................................... 219/272; 373/136; 219/271; 219/275; 219/425; 118/666
[58] Field of Search .............. 219/271, 272, 275, 420, 219/421, 425, 354, 358; 136/240, 236, 230; 118/726, 727, 666, 667; 374/179, 180, 181, 182; 432/262; 373/135, 136, 145, 147, 148; 427/86, 248.1

[56] References Cited

U.S. PATENT DOCUMENTS

| | | | |
|---|---|---|---|
| 3,508,975 | 4/1970 | Osovitz | 136/236 |
| 3,615,931 | 10/1971 | Arthur | 148/175 |
| 3,925,146 | 12/1975 | Olsen | 427/248.1 |
| 4,001,099 | 1/1977 | Wang | 427/248.1 |
| 4,181,544 | 1/1980 | Cho | 427/86 |
| 4,239,955 | 12/1980 | Cho | 219/271 |

OTHER PUBLICATIONS

"Molecular Beam Epitaxy," edited by Brian R. Pamplin, Pergamon Press, 1980, pp. 23–30.
"Molecular Beam Epitaxy," Progress in Solid-State Chemistry, vol. 10, Part 3, (1975), pp. 147–160.
"Molecular Beam Epitaxy," ACTA Electronica, 16, 4, 1973, pp. 323–329.
"A Simple Source Cell Design for MBE," Journal of Vacuum Science and Technology, vol. 20, p. 252, 1982.

Primary Examiner—B. A. Reynolds
Assistant Examiner—Teresa J. Walberg
Attorney, Agent, or Firm—F. L. Masselle; E. T. Grimes; R. A. Hays

[57] ABSTRACT

An effusion cell assembly is disclosed and includes a temperature sensor designed to balance sensor temperature and cell crucible temperature by an increased heat radiation collection.

7 Claims, 2 Drawing Figures

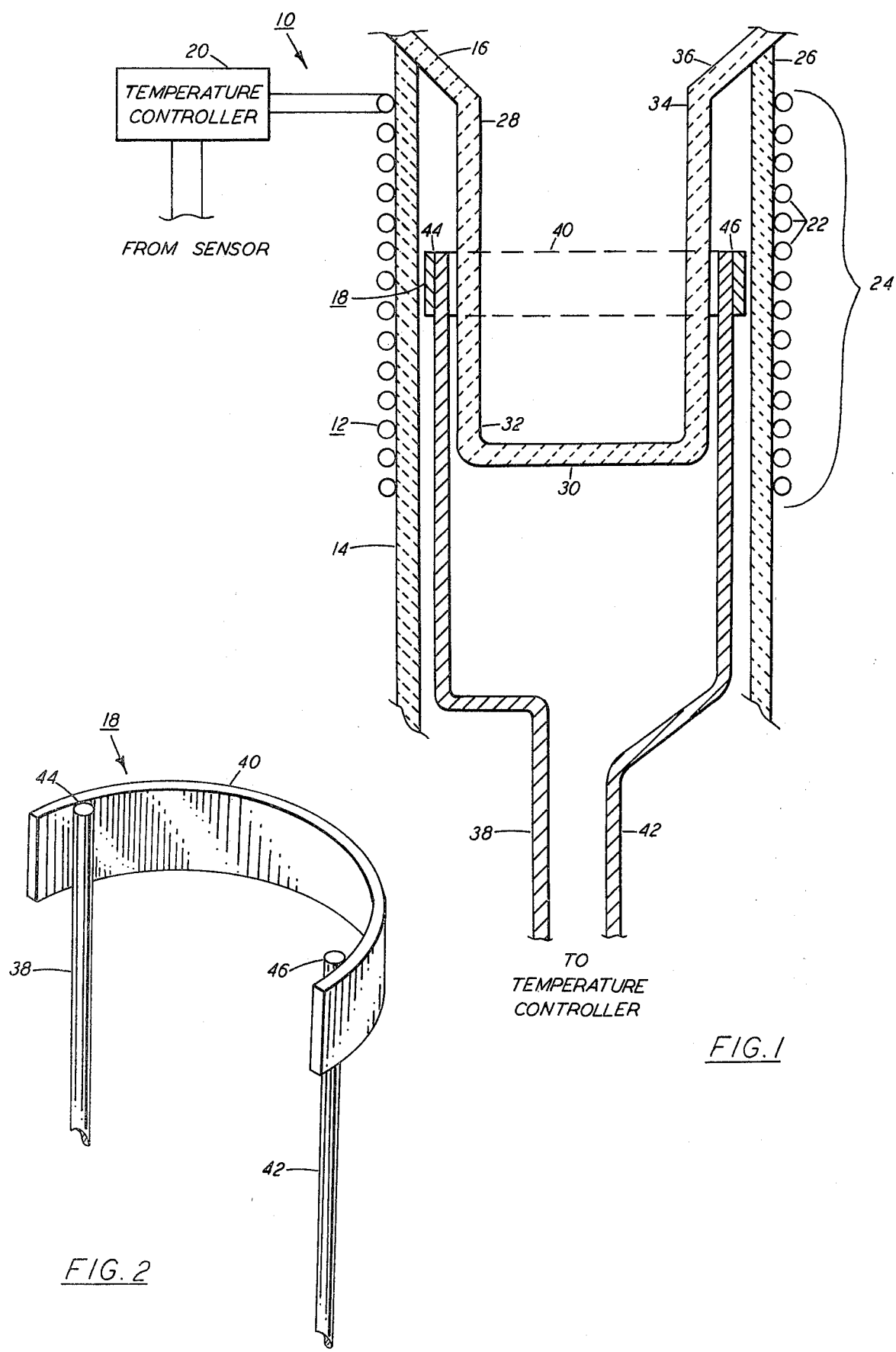

TEMPERATURE SENSOR ASSEMBLY

BACKGROUND OF THE INVENTION

The present invention generally relates to a temperature sensor assembly and, in particular, relates to such an assembly adapted for use in conjunction with a molecular beam epitaxial growth effusion cell.

In the general field of semiconductor manufacturing one of the most technologically sophisticated systems is known as the molecular beam epitaxial growth system (hereinafter referred to as MBE or an MBE system). In very simplified terms an MBE system is one in which thermally excited atoms, or molecules, of one or more materials, for example a dopant, are produced in effusion cells and, as beams, bombard a semiconductor substrate. By bombarding the substrate in an accurate and selective fashion, well defined layers of various compositions are formed on the substrate. These well defined layers then serve as the essential structure for fabrication of semiconductor devices. The thickness of these layers can, by, inter alia, computer controlled mechanisms, be very accurately controlled thus resulting in well defined device structures. As one skilled in the semiconductor art will recognize, a critical factor in the fabrication of a semiconductor device on a substrate, is in the depth composition, or dopant profile, of the layered structure. Ideally, in most instances, the composition should be uniform throughout a particular layer. MBE systems appear capable of producing structures consisting of well defined and abrupt interfaces. It is in furtherance of this goal that the present temperature sensor assembly is directed.

One of the most critical components of an MBE system is the effusion cell. In general, an effusion cell is the source of the atomic, or molecular, beam. Usually a material is placed in the effusion cell, which is effectively a crucible of refractory material, and heated to a temperature at which a beam of atoms, or molecules, are emitted. The beam fluxes, i.e., the cross-sectional density of atoms, or molecules, impinging upon the substrate directly determines the composition and growth rate for each molecular, or atomic, layer of the structure.

The beam flux impinging on the substrate is directly proportional to the vapor pressure of the dopant in the effusion cell. The vapor pressure is dependent upon the temperature of the cell. In fact, a 0.5° C. change in the cell temperature typically results in a 1% change in the beam flux. Thus, it is profoundly clear that if various devices' or more specifically, the composition and thickness of the various layers, are to be reproducible it is imperative to be able to very accurately maintain a constant cell temperature and to be able to reproduce that same temperature.

Conventionally, the effusion cell temperature is monitored by means of a thermocouple junction placed either under or on the side of the crucible. Both positions are quite poor, and consequently, it is not presently possible to accurately monitor and reproduce a given effusion cell temperature. Specifically, if the thermocouple is positioned under the crucible the dominant mechanism for heat reaching the junction is by conduction transfer from the bottom of the crucible. However, thermal conduction between any two adjacent materials is directly related to the actual force working to maintain contact. In such a case then, the thermal conduction between two adjacent materials is directly related to the pressure therebetween. In the present case, the pressure is, for all intents and purposes, the combined weight of the crucible and its contents. However, as the contents escape by vapor the pressure between the crucible and the junction is reduced. Consequently, the thermal conduction varies and the temperature reading varies. Hence, it is a rather inaccurate method. As a further inherent error of the above-described positioning problem, significant cooling of the thermocouple junction itself occurs when the conducted heat into the junction is small because heat lost through the wires of the junction is relatively large.

SUMMARY OF THE INVENTION

Accordingly, it is one object of the present invention to provide a temperature sensor assembly which can be used to accurately monitor or reproduce the temperature of an effusion cell.

This object is accomplished, at least in part, by an assembly including first and second thermocouple junctions having a common element and being spaced apart thereby.

Other objects and advantages will become apparent to those skilled in the art from the following detailed description in conjunction with the appended claims and the drawing affixed hereto.

BRIEF DESCRIPTION OF THE DRAWING

The drawing affixed hereto, which is not drawn to scale, includes:

FIG. 1, which is a cross-sectional view of an assembly embodying the principles of the present invention; and FIG. 2, which is a pictorial view of a temperature sensor embodying the principles of the present invention.

DETAILED DESCRIPTION OF THE INVENTION

An assembly, generally indicated at 10 in FIG. 1, embodying the principles of the present invention, includes a heater 12 mounted on a heater support 14, a crucible 16 positioned so as to be heatable by the heater 12, a temperature sensor 18 and a means 20 for monitoring and controlling the temperature of the crucible 16.

In one specific effusion cell assembly 10 the heater 12 is implemented by a filament coil 22 wrapped around a portion 24 of a ceramic tube 26 which serves as a heater support 14. Preferably, the heater 12 is formed by a tantalum wire coiled about a tube 26 of pyrolitic boron nitride. Of course, other materials can also be employed. In one embodiment, the tube 26 is selected with an inside diameter of about 2.1 centimeters and an outside diameter of about 2.2 centimeters. The coil 22 is wrapped such that adjacent coils thereof are spaced apart by about 3.2 centimeters. As more fully discussed below, in the preferred embodiment the crucible 16 is preferably designed so that the heater support 14 also acts as a positional stop and support therefore.

The crucible 16 includes a circular cylindrical wall 28 having a length of about 7.6 centimeters and a bottom 30 at one end 32 thereof, the other end 34 being open such that material to be vaporized can be placed in the crucible 16. Preferably, the crucible 16 is formed from a single integral unit of refractory material or a ceramic, such as pyrolytic boron nitride and is formed with an outwardly flared lip 36 at the other, or open, end 34 thereof. In practice, the crucible 16 has an outside diameter of about 1.9 centimeters and an inside diameter of about 1.7 centimeters, thus resulting in a wall 28 thickness of about 2 millimeters.

As shown in FIG. 1, the flared lip 36 at the other end 34 of the cylinder wall 28 extends outwardly a distance which ensures that the crucible 16 rests upon, and is thus supported by, the heater support 14. Thus, the ceramic tube 26 is used not only to support the filament coil 22, but also to reproducibly locate any crucible 16 inserted thereinto. In the specific embodiment described above, there exists a gap of about 2 millimeters between the crucible 16 and the ceramic tube 26 in which the temperature sensor 18 is positioned.

In an MBE system, the effusion cell assembly 10 operates in an ultra-high vacuum environment (about $10^{-10}$ Torr). Thus, heat transfer occurs either by radiation or conduction, i.e., there is no mechanism available for convection heat transfer. The term convection is used herein to mean the transfer of heat by the circulation of a fluid, i.e., a liquid or gas. Reliance upon conduction as a heat transfer mechanism is, as discussed in the background, quite unreliable. Further, to increase the accuracy or heat gathering ability of a junction operating in a conduction mode, the physical area of contact must be increased. This is an unacceptable approach in an effusion cell assembly 10 such as described herein simply because of the small dimensions of the available locations for such a junction. Nevertheless, some heat is inevitably conducted away from the junction by the wires connected thereto. Thus, based upon these considerations, it has been concluded that the primary heat transfer mechanism which should be relied upon is radiation. As mentioned above, reliance upon radiation is not without difficulties, specifically because the heat radiated to the crucible 16 from the coil 22 itself is significantly different than that radiated from the spaces intermediate the coil winding.

Referring specifically to FIG. 2, a preferred embodiment of the temperature sensor 18 is shown to include a first wire 38, affixed, for example, by known welding techniques, to a band 40, and a second wire 42 also affixed to the band 40. The wires 38 and 42 and the band 40 are chosen so that the first and second thermocouple junctions 44 and 46, respectively, are formed at the connection therebetween. Hence, the first and second thermocouple junction, 44 and 46, respectively, have a common element in, and are spaced apart by, the band 40. The materials of the wires, 38 and 42, and the band 40 are chosen such that when an EmF, i.e., and electromotive force, also referred to as a voltage, is generated by the junction, 44 and 46 respectively, the resultant current flows in a direction from wire 38 into the band 40 and from the band 40 into the wire 42.

In a specific embodiment, wire 38 is chosen to be tungsten alloyed with about 3% rhenium, wire 42 is chosen to be a similar tungsten alloy having about 25% rhenium, and the band 40 is tantalum. Although other combinations of materials can be chosen which will result in the desired current flow, these materials were selected since the operating temperature of the cell assembly 10 can range to over 1400° C.

This sensor 18, by virtue of the spaced apart junctions, 44 and 46, provides the distinct advantage of substantially eliminating thermal conduction effects. This result can be easily recognized from an analysis of the formula for heat conduction loss, Q, at a given temperature, i.e., $$Q = (KA/L)\Delta T$$

wherein:
K is a conductively constant;
A is the cross-sectional area of the wires;
L is the length of the wires; and
$\Delta T$ is the temperature difference.

There are two paths for heat flowing through the sensor 18. The radiant heat transfer path is from the heater 22 to the sensor 18 and from the sensor 18 to the crucible 16. The second heat transfer occurs from the sensor 18 to ambient temperature by conduction down the lead wires 38 and 42 of the sensor 18. From this it can be seen that the radiant heat from the heater 22 is equal to the sum of heat lost by radiation to the crucible 16 plus the heat lost to the thermocouple support, i.e., the ambient, by conduction. The shape of the sensor 18 with its collection band ensures that the incoming radiant heat from the heater 22 is so large compared to the heat lost by conduction that conduction can be effectively ignored. On this basis, the heat transfer to and from the sensor 18 is effectively radiative, and the temperature of the sensor 18 will be nearly the average of the heater 22 and crucible temperatures. Since, in the preferred embodiment, the $\Delta T$ between heater 22 and crucible 16 is about 20° C., the temperature of the sensor 18 is approximately 10° above the temperature of the crucible 16 and therefore reproducibly related thereto. It should be noted that the metal band 40 must be of sufficient thickness to ensure that heat is conducted around the band 40 to the junction.

A specific embodiment of a sensor 18 which has been found to be quite excellent includes wires, 38 and 42, of 0.5 millimeter diameter and a tantalum band 40 having 13 micrometers thickness, about 6.3 millimeter width and a length such that the band 40 extends about 180° around the crucible 16.

In such an embodiment, the wires, 38 and 42, are also designed to be the sole supports of the band 40 which can be positioned within the gap between the crucible 16 and the tube 26. As a consequence, the temperature of the crucible 16 can be reproducibly monitored. As a further consequence, the band 40, having such a width intercepts the radiation path of a plurality of windings of the coil 22 and is therefore effectively unaffected by the relative temperature difference between the coil and adjacent spacings.

The monitoring and control function for the effusion cell assembly 10 is accomplished by means well known in the art. In the embodiment shown, the wires 38 and 42, as well as the heater 12, are depicted as being connected to a temperature controller 20. Of course, the temperature controller can be a computer programmable device such as presently used in conventional MBE systems.

In operation, a material, such as liquid Gallium, solid Arsenic or solid Aluminum, is placed in the crucible 16 which is then inserted into the ceramic tube 26. After the remainder of the MBE system is adjusted, the temperature of the crucible 16 is raised to the appropriate vaporization temperature, i.e., about 1000° C. for Gallium, about 350° C. for Arsenic or about 1100° C. for Aluminum, by means of the temperature controller 20. Throughout the vaporization, the temperature of the crucible 16 is sensed by sensor 18 and monitored by the controller 10 which regulates the current flowing in the heater 12 to maintain the temperature of the crucible 16 constant.

Although the present invention has been described herein in conjunction with a specific embodiment and application, other configurations can also be used; hence, this description is considered illustrative and not limiting. Thus, the present invention is deemed to be defined by the appended claims and the reasonable interpretation thereof.

What is claimed is:

1. A temperature sensor assembly comprising:
   a crucible;
   means, substantially surrounding said crucible, for radiantly heating said crucible;
   a band of thermally conductive material positioned between said crucible and said means;
   first and second wires affixed to said band and being spaced apart thereby, said first and second wires forming first and second thermocouple junctions with said band where affixed thereto; and
   means, connected to said wires and said heating means, for monitoring and controlling the temperature of said crucible.

2. Assembly as claimed in claim 1 wherein:
   said means for radiant heating includes a ceramic support tube having a filament coil wrapped about a portion thereof; and
   said crucible being cooperatively adapted to be inserted into and supported by said tube.

3. Assembly as claimed in claim 2 wherein:
   said band is provided with a width greater than the linear distance between two adjacent windings of said coil.

4. Assembly as claimed in claim 1 wherein:
   said band is supported solely by said wires.

5. Assembly as claimed in claims 1 or 4 wherein:
   said wires and said band are cooperatively selected so as to permit current flow from said first wire through said band and from said band through said second wire when a thermally created electromotive force exists at said first and second junction.

6. Assembly as claimed in claim 5 wherein:
   said first wire is a tungsten alloy having about 3% rhenium;
   said second wire is a tungsten alloy having about 25% rhenium; and
   said band is tantalum.

7. Assembly as claimed in claim 1 wherein:
   said band is exposed to only radiant heat transfer.

* * * * *